(12) United States Patent
Lee et al.

(10) Patent No.: US 9,041,219 B2
(45) Date of Patent: May 26, 2015

(54) MULTI CHIP PACKAGE, MANUFACTURING METHOD THEREOF, AND MEMORY SYSTEM HAVING THE MULTI CHIP PACKAGE

(75) Inventors: Byung-Hyun Lee, Seongnam-si (KR); Hoon Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 13/450,164

(22) Filed: Apr. 18, 2012

(65) Prior Publication Data

US 2012/0267791 A1 Oct. 25, 2012

(30) Foreign Application Priority Data

Apr. 19, 2011 (KR) .................. 10-2011-0035951

(51) Int. Cl.
| | |
|---|---|
| *H01L 23/48* | (2006.01) |
| *H01L 23/52* | (2006.01) |
| *H01L 29/40* | (2006.01) |
| *H01L 23/525* | (2006.01) |
| *G11C 29/00* | (2006.01) |
| *H01L 21/66* | (2006.01) |
| *H01L 25/065* | (2006.01) |
| *H01L 23/00* | (2006.01) |
| *G11C 5/04* | (2006.01) |
| *H01L 25/18* | (2006.01) |

(52) U.S. Cl.
CPC ........... *H01L 23/5252* (2013.01); *H01L 23/481* (2013.01); *H01L 23/5256* (2013.01); *H01L 24/13* (2013.01); *H01L 24/16* (2013.01); *H01L 2224/13009* (2013.01); *H01L 2224/16145* (2013.01); *H01L 2224/32146* (2013.01); *G11C 29/883* (2013.01); *G11C 5/04* (2013.01); *H01L 22/22* (2013.01); *H01L 24/32* (2013.01); *H01L 24/94* (2013.01); *H01L 25/0657* (2013.01); *H01L 25/18* (2013.01); *H01L 2224/05009* (2013.01); *H01L 2224/06181* (2013.01); *H01L 2224/94* (2013.01); *H01L 2924/01005* (2013.01); *H01L 2924/01047* (2013.01); *H01L 2924/014* (2013.01); *H01L 2924/1431* (2013.01); *H01L 2924/1434* (2013.01); *H01L 2924/1436* (2013.01); *H01L 2924/1437* (2013.01); *H01L 2924/1441* (2013.01); *H01L 2924/1443* (2013.01); *H01L 2924/14511* (2013.01); *H01L 2225/06513* (2013.01); *H01L 2225/06541* (2013.01); *H01L 2225/06565* (2013.01); *H01L 2924/1301* (2013.01)

(58) Field of Classification Search
USPC ............... 257/48, 665, 686, 774, 777; 438/15
See application file for complete search history.

(56) References Cited

U.S. PATENT DOCUMENTS 4,697,095 A * 9/1987 Fujii ............................. 327/408
5,502,333 A * 3/1996 Bertin et al. .................. 257/685
(Continued)

FOREIGN PATENT DOCUMENTS

| JP | 8-162537 A | 6/1996 |
|---|---|---|
| KR | 10-2001-0097153 A | 11/2001 |
| KR | 10-2009-0083384 A | 8/2009 |

*Primary Examiner* — Errol Fernandes
(74) *Attorney, Agent, or Firm* — Sughrue Mion, PLLC

(57) ABSTRACT

A multi-chip package is provided. The multi-chip package includes a plurality of chips including at least one bad chip and at least one good chip that are stacked and a plurality of through electrodes each penetrating the chips. A logic circuit included in the at least one bad chip is isolated from each of the plurality of through electrodes.

9 Claims, 12 Drawing Sheets

(56) References Cited

U.S. PATENT DOCUMENTS

| | | |
|---|---|---|
| 6,388,312 B2 | 5/2002 | Lee |
| 7,754,532 B2 | 7/2010 | Farrar |
| 8,426,308 B2 * | 4/2013 | Han et al. ............. 438/639 |
| 2007/0223159 A1 * | 9/2007 | Haba ..................... 361/58 |

* cited by examiner

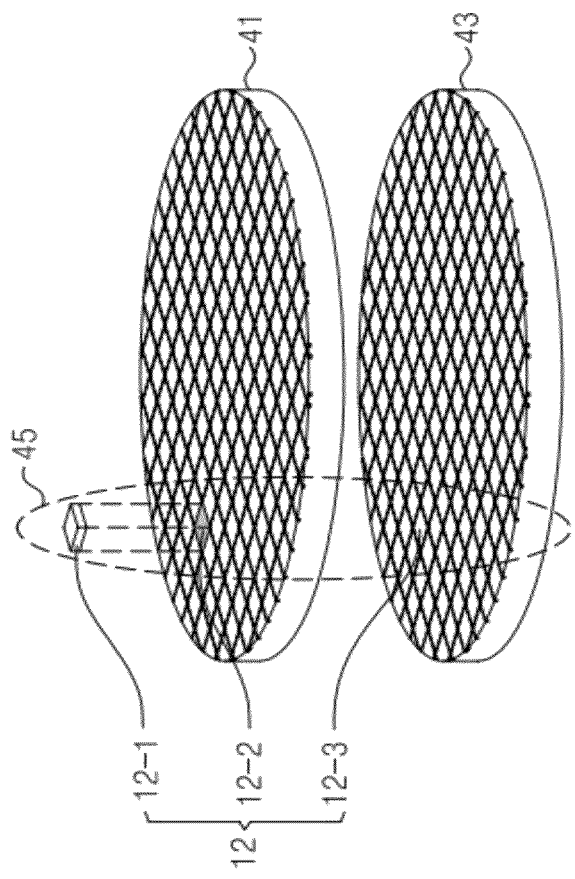
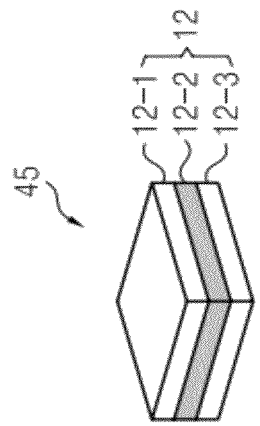

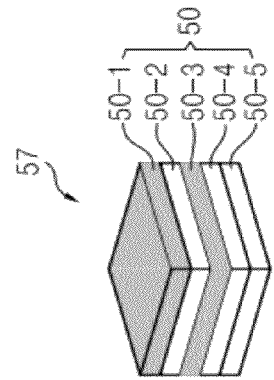
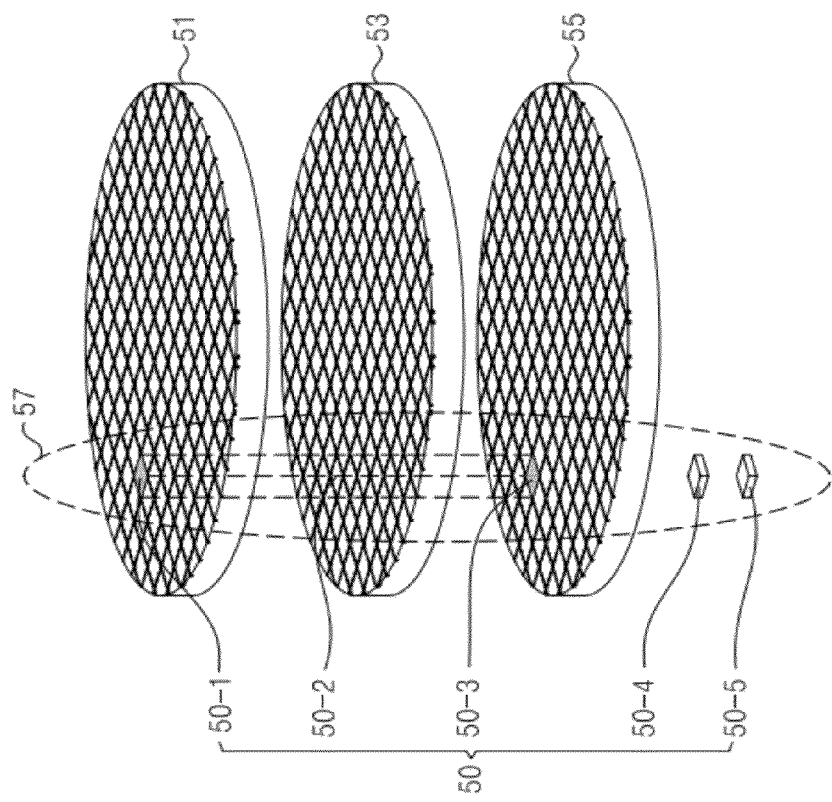
FIG. 5B
FIG. 5A

US 9,041,219 B2

MULTI CHIP PACKAGE, MANUFACTURING METHOD THEREOF, AND MEMORY SYSTEM HAVING THE MULTI CHIP PACKAGE

CROSS-REFERENCE TO RELATED APPLICATION

This application claims priority from Korean Patent Application No. 10-2011-0035951 filed on Apr. 19, 2011, the disclosure of which is hereby incorporated by reference in its entirety.

BACKGROUND

1. Field

Articles of manufacture, systems, and methods consistent with the present inventive concept relate to a multi chip package, and more particularly, to a multi-chip package that increases a manufacturing yield, a manufacturing method thereof, and a memory system having the multi-chip package.

2. Description of the Related Art

As a refining process reaches a limit in a semiconductor chip manufacturing process, costs of manufacturing a semiconductor chip using the refining process are apt to increase. To increase the density of a latest semiconductor memory and a memory module, a conventional two-dimensional (2D) chip manufacturing process technology is being developed to a three-dimensional (3D) chip manufacturing process technology using through silicon via (TSV) technology.

SUMMARY

The present general inventive concept provides a multi-chip package that increases a manufacturing yield by making a multi chip package including a bad chip perform a normal operation, a manufacturing method of the multi-chip package and a memory system including the multi-chip package.

According to an aspect of an exemplary embodiment, there is provided a multi-chip package, including a plurality of chips including at least one bad chip and at least one good chip that are stacked, and a plurality of through electrodes each penetrating the plurality of chips. A logic circuit included in the at least one bad chip is isolated from each of the plurality of through electrodes.

Each of the plurality of through electrodes may be through silicon via (TSV). The logic circuit included in the at least a bad chip may be isolated from each of the plurality of through electrodes by a fuse, an anti-fuse or an efuse. Alternatively, the logic circuit included in the at least one bad chip may be isolated from each of the plurality of through electrodes by post package repair (PPR).

According to another aspect of an exemplary embodiment, there is provided a memory module that comprises the multi-chip package and a semiconductor substrate on which the multi-chip package is mounted.

The memory module may be embodied in a single in-line memory module (SIMM), a dual in-line memory module (DIMM), a registered DIMM, a fully buffered DIMM (FB-DIMM), a small outline dual in-line memory module (SO-DIMM) or a microDIMM.

According to another aspect of an exemplary embodiment, there is provided a memory system that comprises a memory module, a main board, a slot mounted on the main board and in which the memory module may be inserted, and a processor that controls, through the slot, an operation of the at least one good chip included in the multi-chip package mounted on the memory module.

According to another aspect of an exemplary embodiment, there is provided a memory system that comprises the multi-chip package and a memory controller that controls the at least one good chip included in the multi-chip package.

According to another aspect of an exemplary embodiment, there is provided a manufacturing method of the multi-chip package, the method comprises bonding a plurality of wafers in succession, stacking at least one good chip on at least one bad chip included in the plurality of bonded wafers, connecting the at least one bad chip and the at least one good chip electrically, and electrically isolating a logic circuit included in the at least one bad chip from the at least one good chip.

The step of isolating may use a fuse, an anti-fuse or an efuse. Alternatively, the step of isolating may use post package repair (PPR).

According to another aspect of an exemplary embodiment, there is provided a memory module manufacturing method, the method comprising mounting the multi-chip package manufactured by the multi-chip package manufacturing method on a semiconductor substrate.

According to another aspect of an exemplary embodiment, there is provided a memory system manufacturing method, the method comprising mounting a slot on a main board and inserting the memory module manufactured by the manufacturing method of the memory module in the slot.

BRIEF DESCRIPTION OF THE DRAWINGS

These and/or other aspects will become apparent and more readily appreciated from the following description of exemplary embodiments, taken in conjunction with the accompanying drawings of which:

FIGS. 4A and 4B are drawings for explaining a manufacturing method of the multi-chip package illustrated in FIG. 1;

FIGS. 5A and 5B are drawings for explaining a multi-chip package manufacturing method according to another exemplary embodiment;

DETAILED DESCRIPTION

Figure 1:
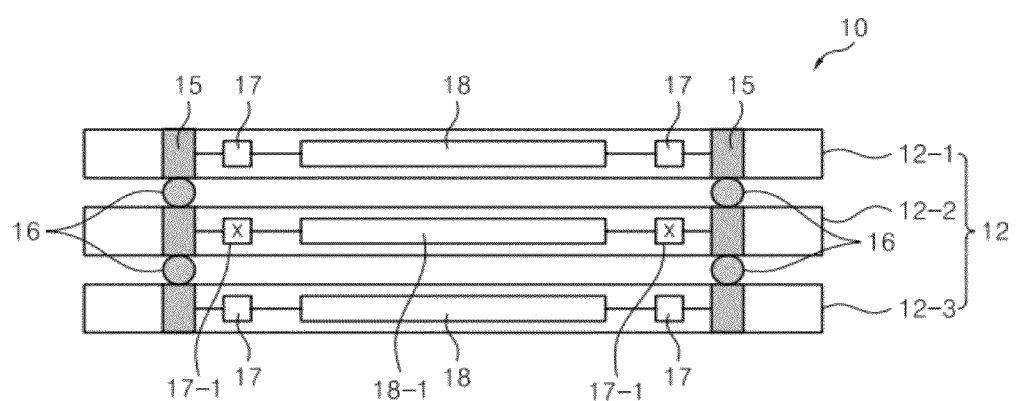
FIG. 1 is a cross-sectional diagram of a multi-chip package including a plurality of chips according to an exemplary embodiment.

Exemplary embodiments now will be described more fully hereinafter with reference to the accompanying drawings. The exemplary embodiments may, however, be embodied in many different forms and should not be construed as limited to the embodiments set forth herein. Rather, these exemplary embodiments are provided so that this disclosure will be thorough and complete. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a cross-sectional diagram of a multi-chip package including a plurality of chips according to an exemplary embodiment. Referring to FIG. 1, a multi chip package 10 includes at least one good chip 12-1 or 12-3 and at least one bad chip 12-2 stacked to each other.

The at least one good chip 12-1 or 12-3 includes a logic circuit 18 and a plurality of connection circuits 17, and the at least one bad chip 12-2 includes a logic circuit 18-1 and a plurality of connection circuits 17-1. A plurality of chips 12 may be connected electrically to a plurality of through electrodes 15 through a plurality of connection elements 16.

FIG. 1 illustrates three chips stacked to each other for convenience of explanation; however, the technical concept of the present inventive concept does not restrict the number of chips stacked to each other.

Each of the plurality of chips 12 may be embodied in a volatile memory chip such as a dynamic random access memory (DRAM), a static random access memory (SRAM), a thyristor RAM (T-RAM), a zero capacitor RAM (Z-RAM) or a twin transistor RAM (TTRAM).

In addition, each of the plurality of chips 12 may be embodied in a non-volatile memory chip such as an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM) also called an ovonic unified memory (OUM), a resistive ram (RRAM or ReRAM), a nanotube RRAM, a polymer RAM (PoRAM), a nano floating gate memory (NFGM), a holographic memory, a molecular electronics memory device or an insulator resistance change memory.

Here, the good chip 12-1 or 12-3 is a chip where a separate chip embodied on a wafer operates normally at a test step. The bad chip 12-2 is a chip where a separate chip embodied on a wafer malfunctions at a test step. Thus, a bad chip may also be denoted as a faulty chip or a malfunctioning chip.

Each of the plurality of through electrodes 15 transmits input data, an address, or a command to a logic circuit 18. Each of the plurality of through electrodes 15 may be a through silicon via (TSV). The TSV is an example of an electrical vertical connection.

Each of the plurality of through electrodes 15 included in each of the plurality of chips 12 may be connected to each other through different connection elements 16. For example, the plurality of connection elements 16 may be a bump or a solder ball. It may be an anisotropic conductive film (ACF) in some cases.

Figure 2:
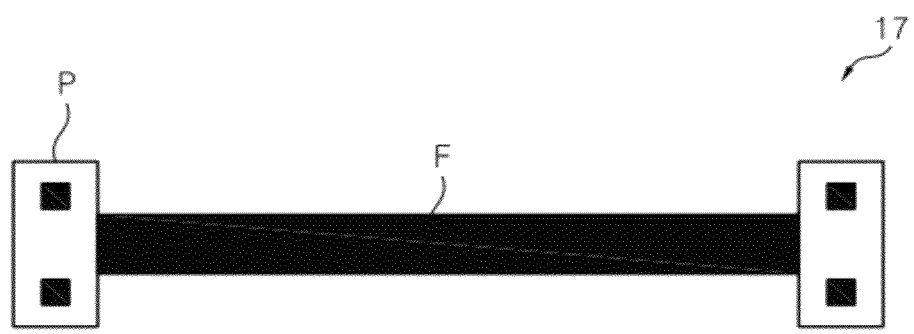
FIG. 2 is a drawing for explaining a connection circuit in FIG. 1.

FIG. 2 is a drawing for explaining a connection circuit in FIG. 1. A connection circuit 17 connected electrically plays a role of connecting the logic circuit 18 included in the good chip 12-1 or 12-3 with each of the plurality of through electrodes 15 electrically. For example, the connection circuit 17 may be embodied in a fusing element.

A connection circuit 17-1 isolated electrically plays a role of isolating a logic circuit 18-1 included in the bad chip 12-2 from each of the plurality of through electrodes 15.

A fusing element 17 includes a fuse F and a pad P. A fuse F may be formed by a chemical mechanical polishing (CMP) method, and a pad P is connected to both sides of the fuse F and connected to each of the plurality of through electrodes 15.

Each configuration of the connection circuits 17 and 17-1 is the same. However, a fuse of the connection circuit 17 is in an un-cut state and a fuse of the connection circuit 17-1 is in a cut state.

When a separate chip is determined to be the bad chip 12-2 through a test in a process of manufacturing each of the plurality of chips 12, a fuse F of a fusing element 17-1 included in the bad chip 12-2 is cut by a laser. When the fuse F is cut, the logic circuit 18-1 included in the bad chip 12-2 and each of the plurality of through electrodes 15 are disconnected electrically each other.

Here, a method of utilizing a laser beam is explained as a method of cutting the fuse F in an exemplary embodiment for convenience of explanation; however, the present inventive concept is not restricted to thereto.

Additionally, the fuse F is explained as an example for isolating the logic circuit 18-1 from each of the plurality of through electrodes 15; however, the present inventive concept is not restricted thereto. For example, an anti-fuse or an efuse may be used instead of the fuse. In addition, the logic circuit 18-1 and each of the plurality of through electrodes 15 may be isolated by post package repair (PPR).

Figure 3:
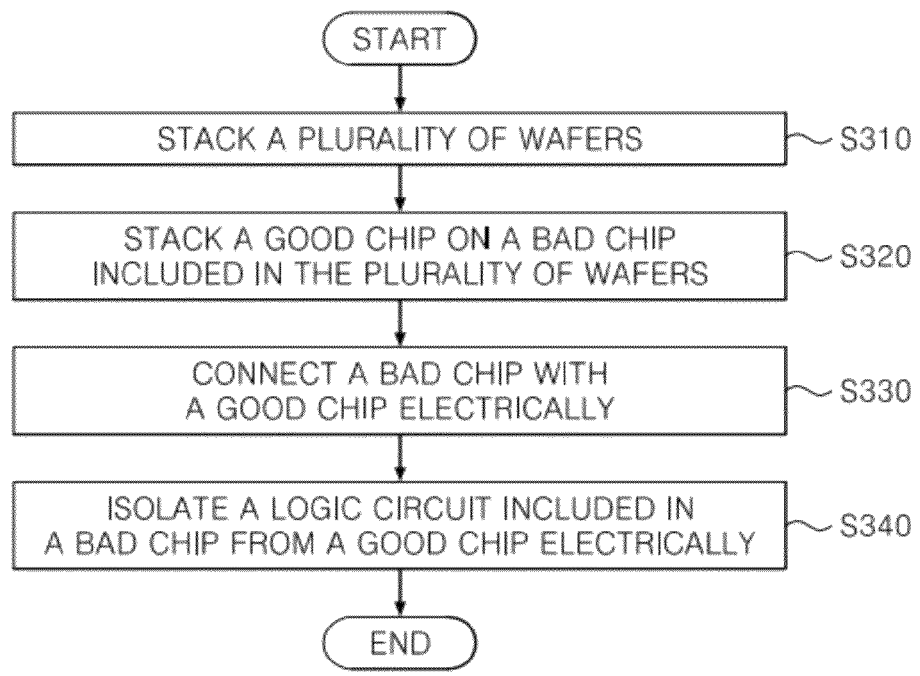
FIG. 3 is a flowchart for explaining a multi-chip package manufacturing method according to an exemplary embodiment.

FIG. 3 is a flowchart for explaining a multi-chip package manufacturing method according to an exemplary embodiment, and FIGS. 4A and 4B are drawings for explaining a manufacturing method of the multi-chip package illustrated in FIG. 1. Referring to FIGS. 1, 3, 4A and 4B, a plurality of wafers 41 and 43 are stacked in succession (S310) and bonded successively. Chips 12 included in each of the plurality of wafers 41 and 43 through a bonding process are connected electrically through the plurality of through electrodes 15 included in the chips 12, e.g., through silicon via (TSV).

At least one good chip 12-1 or 12-3 is stacked on at least one bad chip 12-2 included in a plurality of bonded wafers 41 and 43 (S320). The at least one bad chip 12-2 and the at least one good chip 12-1 or 12-3 are connected electrically (S330). A logic circuit 18-1 included in the at least one bad chip 12-2 is isolated from the at least one good chip 12-1 or 12-3 electrically (S340). It should be noted that operations S330 and S340 may be performed in reverse order.

The logic circuit 18-1 included in the at least one bad chip 12-2 and the at least one good chip 12-1 or 12-3 may be isolated from each other electrically by using a fuse, an anti-fuse or an efuse at a wafer manufacturing stage. The logic circuit 18-1 included in the at least one bad chip 12-2 and the at least one good chip 12-1 or 12-3 may be isolated by using post package repair (PPR) at a multi-chip package manufacturing stage.

FIGS. 5A and 5B are drawings for explaining a multi-chip package manufacturing method according to another exemplary embodiment. Referring to FIGS. 5A and 5B, a plurality of wafers 51, 53 and 55 are stacked successively (S310) and bonded successively. Good chips 50-4 and 50-5 as many as the number of bad chips 50-1 and 50-3 are successively stacked on the bad chips 50-1 and 50-3 included in the plurality of bonded wafers 51, 53 and 55. Here, the good chips 50-4 and 50-5 may be stacked on a wafer 51 stacked at the top or on a wafer 55 stacked at the bottom among the plurality of stacked wafers 51, 53 and 55, or may be stacked on both wafer 51 and wafer 55. For example, FIG. 5A shows good chips 50-4 and 50-5 stacked on the bottom of wafer 55.

In addition, the good chips 50-4 and 50-5 may be stacked after all of the plurality of wafers 51, 53 and 55 are bonded or while the plurality of wafers 51, 53 and 55 are being bonded. A multi-chip package 57 manufactured through the wafer manufacturing process performs a normal operation even though it includes the bad chips 50-1 and 50-3.

Figure 6:
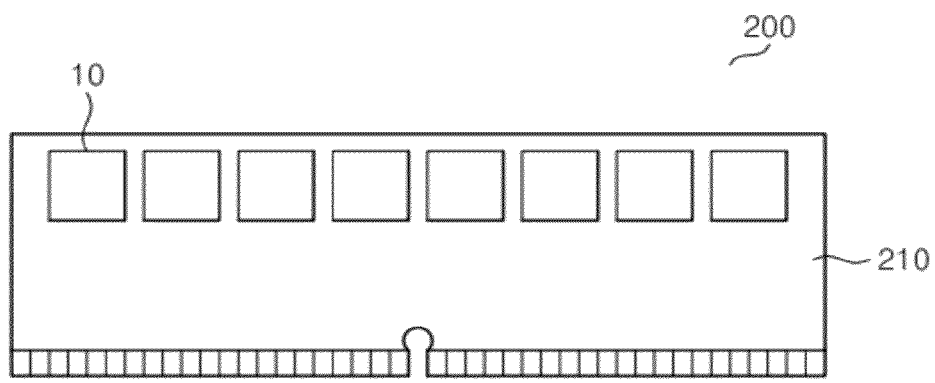
FIG. 6 is a memory module including the multi-chip package illustrated in FIG. 1 according to an exemplary embodiment.

FIG. 6 is a memory module including the multi-chip package illustrated in FIG. 1. Referring to FIG. 6, a memory module 200 includes a semiconductor substrate 210 and a plurality of multi-chip packages 10 mounted on the semiconductor substrate 210.

Each configuration of the plurality of multi-chip packages 10 is substantially the same as configuration of the multi-chip package 10 explained in FIG. 1. The memory module 200 may be embodied in a single inline memory module (SIMM), a double in-line memory module (DIMM), a registered DIMM, a fully buffered DIMM (FBDIMM), a small outline dual in-line memory module (SO-DIMM) or a MicroDIMM.

Figure 7:
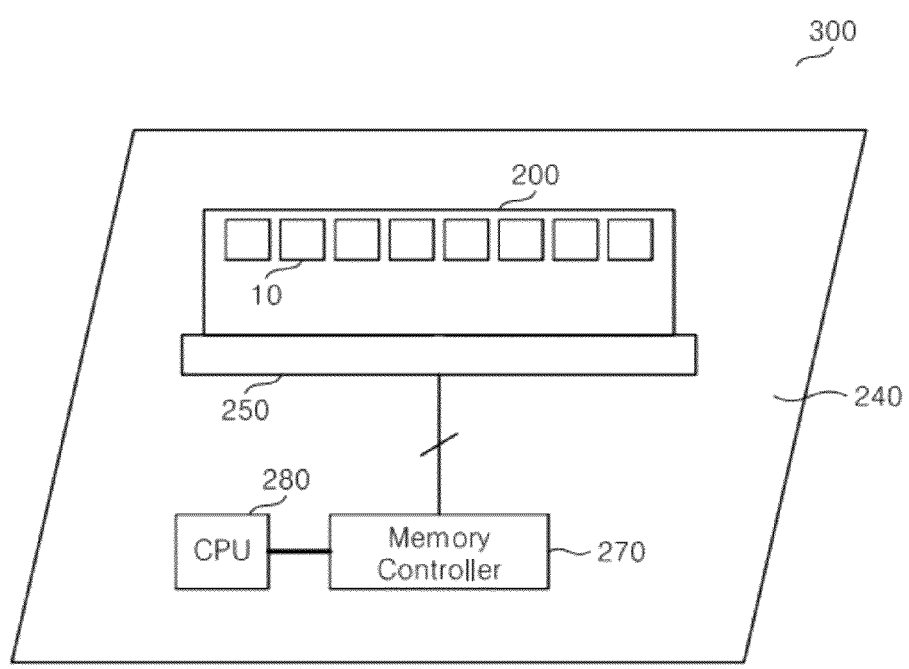
FIG. 7 is an example of a memory system including the memory module illustrated in FIG. 6 according to an exemplary embodiment.

FIG. 7 is an exemplary embodiment of a memory system including the memory module illustrated in FIG. 6. Referring to FIG. 7, a memory system 300 which may be embodied in a computer system such as a personal computer (PC) or a mobile computing device includes a main board 240, a slot 250 mounted on the main board 240, the memory module 200 which may be inserted in the slot 250 and a memory controller 270 which may control operations of the plurality of multi-chip packages 10 mounted on the memory module 200 through the slot 250.

The memory controller 270 may transmit or receive data to/from each of the plurality of multi-chip packages 10 through a data bus according to a control of a central processing unit (CPU) 280. The memory system 300 may be embodied in a PC, a tablet PC or a laptop computer.

Figure 8:
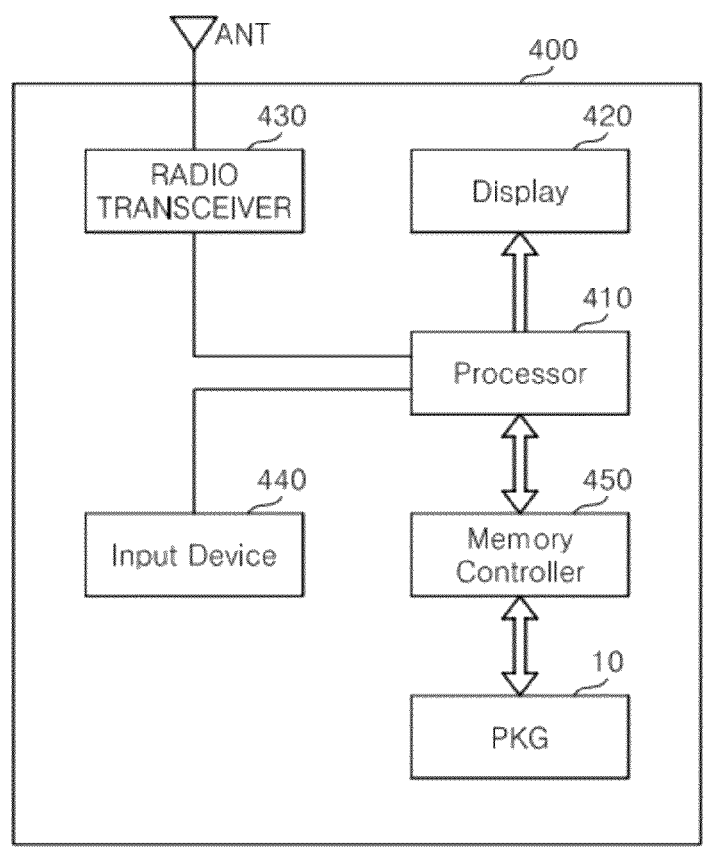
FIG. 8 is another example of a memory system including the multi-chip package illustrated in FIG. 1 according to an exemplary embodiment.

FIG. 8 is another exemplary embodiment of a memory system including the multi-chip package illustrated in FIG. 1. Referring to FIGS. 1 and 8, a memory system 400 may be embodied in a cellular phone, a smart phone, a tablet PC, a personal digital assistant (PDA) or a radio communication device.

The memory system 400 includes a multi-chip package 10 and a memory controller 450 controlling an operation of the multi-chip package 10. The memory controller 450 may control a data access operation of the multi-chip package 10, e.g., a program operation, an erase operation or a read operation, according to a control of a processor 410.

A radio transceiver 430 may transmit or receive a radio signal through an antenna ANT. For example, the radio transceiver 430 may convert a radio signal received through the antenna ANT into a signal which may be processed by the processor 410. Accordingly, the processor 410 may process a signal output from the radio transceiver 430 and transmit a processed signal to the memory controller 450 or the display 420. The memory controller 450 may program or write a signal processed by the processor 410 in the multi-chip package 10. The radio transceiver 430 may also convert a signal output from the processor 410 into a radio signal and output a converted radio signal to an external device through the antenna ANT.

An input device 440 is a device which may input a control signal for controlling an operation of the processor 410 or data to be processed by the processor 410. It may be embodied in a pointing device such as a touch pad and a computer mouse, a keypad or a keyboard.

The processor 410 may control an operation of the display 420 so that data output from the memory controller 450, data output from the radio transceiver 430 or data output from the input device 440 may be displayed through the display 420.

According to an exemplary embodiment, the memory controller 450 which may control an operation of the multi-chip package 10 may be embodied in a part of the processor 410 or in a separate chip from the processor 410.

Figure 9:
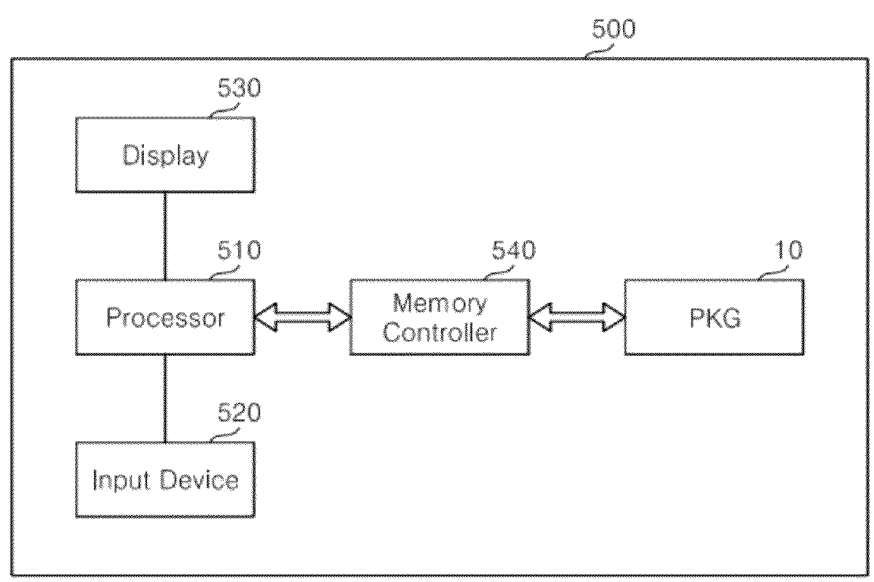
FIG. 9 is still another example of a memory system including the multi-chip package illustrated in FIG. 1 according to an exemplary embodiment.

FIG. 9 is still another exemplary embodiment of a memory system including the multi-chip package illustrated in FIG. 1. A memory system 500 illustrated in FIG. 9 may be embodied in a personal computer (PC), a tablet PC, a net-book, an e-reader, a personal digital assistant (PDA), a portable multimedia player (PMP), a Moving Picture Experts Group Layer-3 (MP3) player or a Moving Picture Experts Group Layer-4 (MP4) player.

The memory system 500 includes a memory controller 540 which may control a data processing operation of a multi-chip package 10. A processor 510 may display data stored in the multi-chip package 10 through a display 530 according to data input through an input device 520. For example, an input device 520 may be embodied in a pointing device such as a touch pad or a computer mouse, a keypad or a keyboard.

The processor 510 may control a general operation of the memory system 500 and an operation of the memory controller 540. According to an exemplary embodiment, the multi-chip package 10 and the memory controller 540 which may control an operation of the multi-chip package 10 may be embodied in a part of the processor 510 or in a separate chip from the processor 510.

Figure 10:
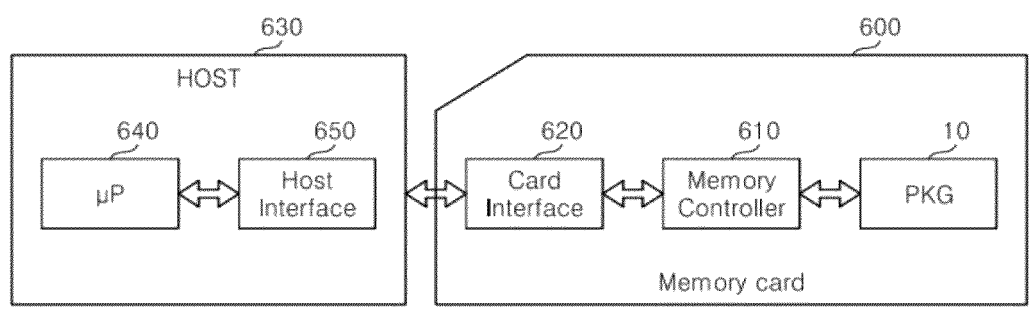
FIG. 10 is still another example of a memory system including the multi-chip package illustrated in FIG. 1 according to an exemplary embodiment.

FIG. 10 is still another exemplary embodiment of a memory system including the multi-chip package 10 illustrated in FIG. 1. A memory system 600 illustrated in FIG. 10 may be embodied in a memory card or a smart card. The memory system 600 includes a multi-chip package 10, a memory controller 610 and a card interface 620.

The memory controller 610 may control data exchange between the multi-chip package 10 and the card interface 620. According to an exemplary embodiment, the card interface 620 may be a secure digital (SD) card interface or a multimedia card (MMC) interface; however, the card interface 620 is not restricted thereto. The card interface 620 may interface data exchange between a host 630 and the memory controller 610 according to a protocol of the host 630.

According to an exemplary embodiment, the card interface 620 may support a universal serial bus (USB) protocol and an interchip (IC)-USB protocol. Here, a card interface may mean hardware supporting a protocol which the host 630 uses, software installed in the hardware or a signal transmission mode.

When the memory system 600 is connected to a host interface 650 of the host 630 such as a PC, a tablet PC, a digital camera, a digital audio player, a cellular phone, console video game hardware or a digital set-top box, the host interface 650 may perform data communication with a non-volatile multi-chip package 10 through the card interface 620 and the memory controller 610 according to a control of a microprocessor 640.

Figure 11:
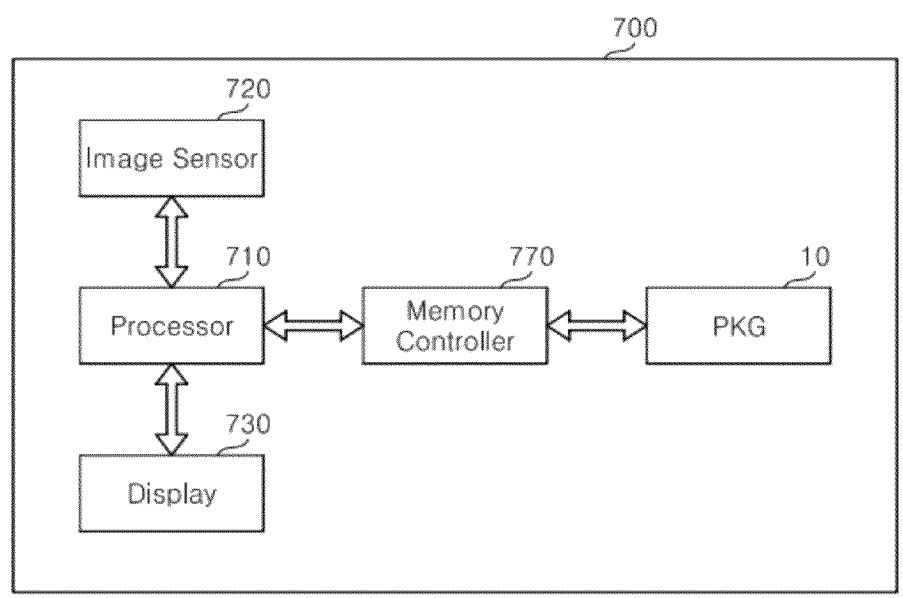
FIG. 11 is still another example of a memory system including the multi-chip package illustrated in FIG. 1 according to an exemplary embodiment.

FIG. 11 is still another exemplary embodiment of a memory system including the multi-chip package 10 illustrated in FIG. 1. A memory system 700 illustrated in FIG. 11 may be embodied in an image processing device, e.g., a digital camera, a cellular phone equipped with the digital camera, a smart phone equipped with the digital camera, or a tablet PC equipped with the digital camera.

The memory system 700 includes a multi-chip package 10 and a memory controller 740 which may control a data processing operation of the multi-chip package 10, e.g., a program operation, an erase operation or a read operation. An image sensor 720 of the memory system 700 converts an optical image into digital signals, and converted digital signals are transmitted to the processor 710 or the memory controller 740. According to a control of the processor 710, the converted digital signals may be displayed through a display 730 or stored in the multi-chip package 10 through the memory controller 740.

In addition, data stored in the multi-chip package 10 are displayed through the display 730 according to a control of the processor 710 or the memory controller 740. According to an exemplary embodiment, the memory controller 740 which may control an operation of the multi-chip package 10 may be embodied in a part of the processor 710 or in a separate chip from the processor 710.

Figure 12:
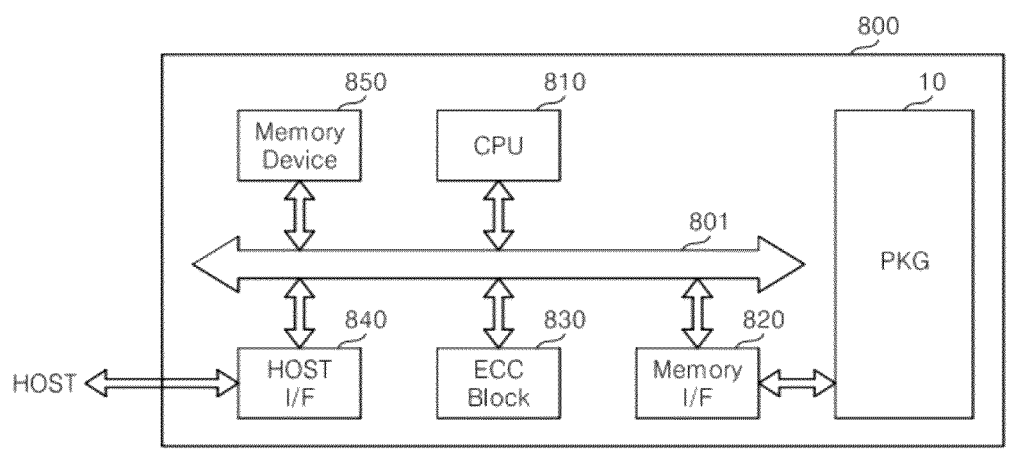
FIG. 12 is still another example of the memory system including the multi-chip package illustrated in FIG. 1 according to an exemplary embodiment.

FIG. 12 is still another exemplary embodiment of a memory system including the multi-chip package illustrated in FIG. 1. Referring to FIG. 12, a memory system 800 includes a multi-chip package 10 and a central processing unit (CPU) 810 which may control an operation of the multi-chip package 10.

The memory system 800 includes a memory device 850 which may be used as an operation memory of the CPU 810. The memory device 850 may be embodied in a non-volatile memory such as a read only memory (ROM) or a volatile memory such as a static random access memory (SRAM). A host connected to the memory system 800 may perform data communication with the multi-chip package 10 through a memory interface 820 and a host interface 840.

An error correction code (ECC) block 830 may detect an error bit included in data output from the multi-chip package 10 through the memory interface 820, correct the error bit, and transmit error-corrected data to a host through the host interface 840 according to a control of the CPU 810. The CPU 810 may control data communication among the memory interface 820, the ECC block 830, the host interface 840 and the memory device 850 through a bus 801.

The memory system 800 may be embodied in a flash memory drive, a USB memory drive, an IC-USB memory drive or a memory stick.

A multi-chip package of the present inventive concept may increase a manufacturing yield by making a multi-chip package including a bad chip perform a normal operation.

Although a few exemplary embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A multi-chip package comprising:
a plurality of chips comprising at least one bad chip and at least one good chip that are stacked; and
a plurality of through electrodes each penetrating the plurality of chips,
wherein the at least one had chip includes a connection circuit and a logic circuit, and the logic circuit included in the at least one bad chip is isolated from each of the plurality of through electrodes by the connection circuit included in the at least one bad chip.

2. The multi-chip package of claim 1, wherein each of the through electrodes is a through silicon via.

3. The multi-chip package of claim 1, wherein the logic circuit included in the at least one bad chip is isolated from each of the plurality of through electrodes by a fuse, an anti-fuse or an efuse.

4. The multi-chip package of claim 1, wherein the logic circuit included in the at least one bad chip is isolated from each of the plurality of through electrodes by post package repair.

5. A memory module comprising:
the multi-chip package of claim 1; and
a semiconductor substrate on which the multi-chip package is mounted.

6. The memory module of claim 5, wherein the logic circuit included in the at least one bad chip is isolated from each of the plurality of through electrodes by post package repair.

7. The memory module of claim 5, wherein the memory module is a single in-line memory module, a dual in-line memory module (DIMM), a registered DIMM, a fully buffered DIMM, a small outline DIMM or a MicroDIMM.

8. A memory system comprising:
the memory module of claim 5;
a main board;
a slot which is mounted on the main board and in which the memory module may be inserted; and
a processor configured to control, through the slot, an operation of the at least one good chip included in the multi-chip package mounted on the memory module.

9. A memory system comprising:
the multi-chip package of claim 1; and
a memory controller configured to control the at least one good chip included in the multi-chip package.

* * * * *